United States Patent
Baccini et al.

(10) Patent No.: US 9,204,556 B2
(45) Date of Patent: Dec. 1, 2015

(54) AUTOTUNED SCREEN PRINTING PROCESS

(75) Inventors: Andrea Baccini, Treviso (IT); Marco Galiazzo, Padua (IT)

(73) Assignee: Applied Materials, Inc., Santa Clara, CA (US)

( * ) Notice: Subject to any disclaimer, the term of this patent is extended or adjusted under 35 U.S.C. 154(b) by 928 days.

(21) Appl. No.: 13/202,965

(22) PCT Filed: May 25, 2009

(86) PCT No.: PCT/EP2009/056326
§ 371 (c)(1),
(2), (4) Date: Oct. 28, 2011

(87) PCT Pub. No.: WO2010/094345
PCT Pub. Date: Aug. 26, 2010

(65) Prior Publication Data
US 2012/0045852 A1 Feb. 23, 2012

(30) Foreign Application Priority Data

Feb. 23, 2009 (IT) .............................. UD2009A0043

(51) Int. Cl.
*H01L 21/66* (2006.01)
*H05K 3/12* (2006.01)
(Continued)

(52) U.S. Cl.
CPC .......... *H05K 3/1216* (2013.01); *B41F 15/0818* (2013.01); *B41F 15/20* (2013.01); *H01L 21/67259* (2013.01); *H01L 31/022425* (2013.01); *H01L 31/18* (2013.01); *H01L 31/1876* (2013.01); *B41P 2215/10* (2013.01); *B41P 2215/114* (2013.01);
(Continued)

(58) Field of Classification Search
CPC .................. H05K 3/1216; H05K 2201/09918; H01L 21/67259
USPC .......................................................... 438/401
See application file for complete search history.

(56) References Cited

U.S. PATENT DOCUMENTS 4,478,879 A   10/1984   Baraona et al.
6,011,629 A   1/2000    Ootake et al.
(Continued)

FOREIGN PATENT DOCUMENTS

CN   1429707 A      7/2003
JP   05-229097      9/1993
(Continued)

OTHER PUBLICATIONS

JP Office Action for Patent Application No. 2011-550429 dated Sep. 24, 2013.
(Continued)

*Primary Examiner* — Xiao Zhao
(74) *Attorney, Agent, or Firm* — Patterson & Sheridan, LLP

(57) ABSTRACT

Embodiments of the invention generally provide apparatus and methods of screen printing a pattern on a substrate. In one embodiment, a patterned layer is printed onto a surface of a substrate along with a plurality of alignment marks. The locations of the alignment marks are measured with respect to a feature of the substrate to determine the actual location of the patterned layer. The actual location is compared with the expected location to determine the positional error of the patterned layer placement on the substrate. This information is used to adjust the placement of a patterned layer onto subsequently processed substrates.

21 Claims, 8 Drawing Sheets

(51) Int. Cl.
  *B41F 15/08* (2006.01)
  *B41F 15/20* (2006.01)
  *H01L 21/67* (2006.01)
  *H01L 31/0224* (2006.01)
  *H01L 31/18* (2006.01)
  *H05K 3/00* (2006.01)

(52) U.S. Cl.
  CPC .......... *B41P 2233/52* (2013.01); *H05K 3/0097* (2013.01); *H05K 2201/09781* (2013.01); *H05K 2201/09918* (2013.01); *H05K 2203/163* (2013.01); *Y02E 10/50* (2013.01)

(56) References Cited

U.S. PATENT DOCUMENTS

| | | | |
|---|---|---|---|
| 6,229,618 B1 * | 5/2001 | Tomimatu | 356/516 |
| 2002/0019065 A1 | 2/2002 | Marini | |
| 2002/0063856 A1 * | 5/2002 | Inoue | 355/53 |
| 2005/0194037 A1 * | 9/2005 | Asai | 136/256 |

FOREIGN PATENT DOCUMENTS

| | | | |
|---|---|---|---|
| JP | 2002-225221 A | | 8/2002 |
| JP | 2003-191432 A | | 7/2003 |
| JP | 2004-136569 A | | 5/2004 |
| WO | WO-2007/008941 A2 | | 1/2007 |
| WO | WO-2008/042581 A2 | | 4/2008 |
| WO | WO-2008/086992 A1 | | 7/2008 |
| WO | 2008-100646 A2 | | 8/2008 |

OTHER PUBLICATIONS

CN Office Action for Application No. 200980157608.2 dated Mar. 11, 2014.
Italian Search Report, Application No. IT UD20090043, Nov. 9, 2009.
International Search Report, Application No. PCT/EP2009/056326, Nov. 24, 2009.
Chinese Office Action, CN 200980157608.2 dated Jul. 11, 2013.

\* cited by examiner

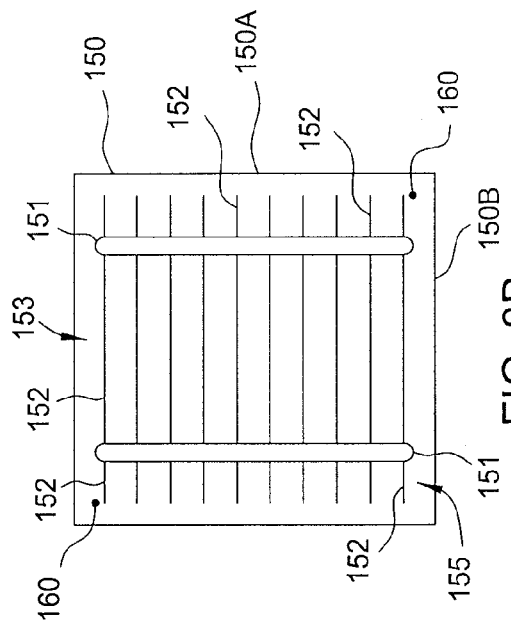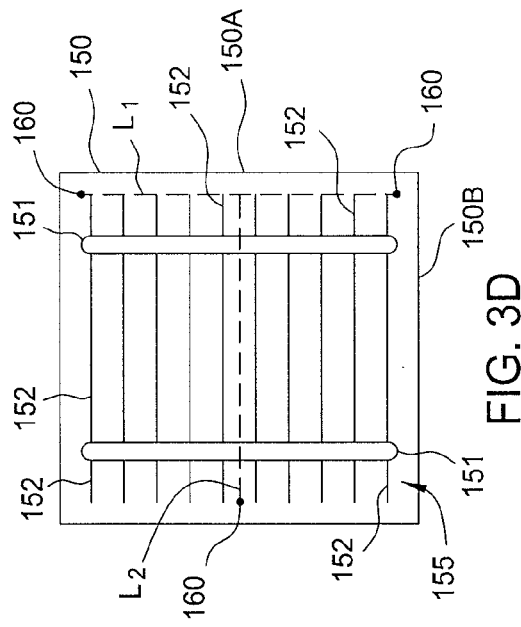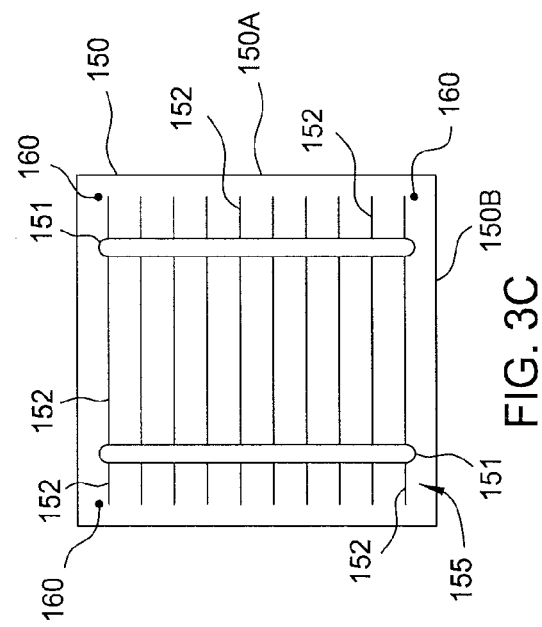

AUTOTUNED SCREEN PRINTING PROCESS

BACKGROUND OF THE INVENTION

1. Field of the Invention

Embodiments of the present invention generally relate to a system and process for screen printing a multiple layer pattern on a surface of a substrate.

2. Description of the Related Art

Solar cells are photovoltaic (PV) devices that convert sunlight directly into electrical power. Solar cells typically have one or more p-n junctions. Each p-n junction comprises two different regions within a semiconductor material where one side is denoted as the p-type region and the other as the n-type region. When the p-n junction of a solar cell is exposed to sunlight (consisting of energy from photons), the sunlight is directly converted to electricity through the PV effect. Solar cells generate a specific amount of electric power and are tiled into modules sized to deliver the desired amount of system power. Solar modules are joined into panels with specific frames and connectors. Solar cells are commonly formed on silicon substrates, which may be single or multicrystalline silicon substrates. A typical solar cell includes a silicon wafer, substrate, or sheet typically less than about 0.3 mm thick with a thin layer of n-type silicon on top of a p-type region formed on the substrate.

The PV market has experienced growth at annual rates exceeding 30% for the last ten years. Some articles suggest that solar cell power production world-wide may exceed 10 GWp in the near future. It is estimated that more than 95% of all solar modules are silicon wafer based. The high market growth rate in combination with the need to substantially reduce solar electricity costs has resulted in a number of serious challenges for inexpensively forming high quality solar cells. Therefore, one major component in making commercially viable solar cells lies in reducing the manufacturing costs required to form the solar cells by improving the device yield and increasing the substrate throughput.

Screen printing has long been used in printing designs on objects, such as cloth or ceramics, and is used in the electronics industry for printing electrical component designs, such as electrical contacts or interconnects on the surface of a substrate. State of the art solar cell fabrication processes also use screen printing processes. The mis-alignment of a screen printing pattern on a substrate surface due to errors in the positioning of a substrate on the automated transferring devices, or defects on the edge of the substrate, can lead to poor device performance, and thus device yield issues. Manual calibration of the positioning of the substrate within the system can be time consuming and require frequent adjustment based on differences in batches of substrates or drift in the calibrated position of the substrate.

Therefore, there is a need for a screen printing apparatus for the production of solar cells, electronic circuits, or other useful devices that has an improved method of controlling the device positioning within the system, increased throughput and a lower cost of ownership than other known apparatuses.

SUMMARY OF THE INVENTION

The present invention may generally provide an automated deposition process, comprising: positioning a first substrate on a substrate support, wherein the first substrate has at least one feature, depositing a layer of a material in a pattern onto a surface of the first substrate, wherein the pattern includes at least two alignment marks, determining the actual orientation and position of the at least two alignment marks with respect to the at least one feature of the first substrate using a system controller, and depositing a layer of a material onto a surface of a second substrate in an adjusted orientation or adjusted position relative to at least one feature of the second substrate using the information received by the system controller during the determining the actual orientation and actual position of the at least two alignment marks, wherein the orientation or position of the material deposited on the second substrate is closer to an expected orientation or expected position than the orientation or position of the material deposited on the first substrate to the expected orientation or expected position.

Embodiment of the invention may further provide an automated deposition process, comprising: positioning a first substrate on a substrate support, wherein the first substrate has at least one feature, analyzing the orientation and position of the first substrate on the substrate support using a system controller, depositing a layer of a material in a pattern onto a surface of the first substrate, wherein the pattern includes at least two alignment marks and is aligned to the at least one feature of the first substrate using the data received by the system controller during the analyzing the orientation and position of the substrate, determining the actual orientation and actual position of the deposited layer on the first substrate using the system controller, calculating an offset of between the actual orientation and actual position of the deposited layer of material and an expected orientation and expected position, and depositing a layer of a material in a pattern onto on a second substrate using the calculated offset so that the orientation or position of the material deposited on the second substrate is closer to an expected orientation or expected position than the orientation or position of the material deposited on the first substrate to the expected orientation or expected position.

Embodiment of the invention may further provide an automated deposition process, comprising: positioning a first substrate that is disposed on a substrate support in a first position, wherein the first substrate has at least one feature, analyzing the orientation and position of the first substrate on the substrate support that is positioned in the first position using an optical inspection system and a system controller, depositing a layer of a material in a pattern onto a surface of the first substrate that is disposed on the substrate support at a second position, wherein the pattern includes at least two alignment marks and is aligned to the at least one feature of the first substrate using the data received by the system controller during the analyzing the orientation and position of the first substrate, positioning the first substrate and the substrate support in the first position, determining the actual orientation and actual position of the deposited layer on the first substrate that is positioned in the first position using the optical inspection system and the system controller, calculating an offset of between the actual orientation and actual position of the deposited layer of material and an expected orientation and expected position, and depositing a layer of a material in a pattern onto on a second substrate that is disposed on the substrate support in the second position using the calculated offset so that the orientation or position of the material deposited on the second substrate is closer to an expected orientation or expected position than the orientation or position of the material deposited on the first substrate to the expected orientation or expected position.

Embodiment of the invention may further provide an automated deposition processing system, comprising: a rotary actuator having a substrate support disposed thereon and movable between a first position and a second position, an input conveyor positioned to load a first substrate onto the substrate support in the first position, a screen printing chamber having an adjustable screen printing device disposed therein, the screen printing chamber positioned to print a pattern onto the first substrate when the substrate support is in the second position, an optical inspection assembly having a camera and a lamp, the optical inspection assembly positioned to capture optical images of a first layer of the pattern when the substrate support is in the first position, and a system controller comprising software configured to determine an offset of an actual position of the alignment marks captured in the optical image of the first layer of the pattern with respect to an expected position of the alignment marks and adjust the screen printing device to account for the determined offset prior to printing a second layer of the pattern on a second substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A illustrates various examples of alignment marks to be printed on a substrate according to one embodiment of the present invention.

FIGS. 3B-3D illustrate various configurations of alignment marks on a front surface of a substrate according to embodiments of the present invention.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide an apparatus and method for processing substrates in a screen printing system that utilizes an improved substrate transferring, aligning, and screen printing process that can improve the device yield performance and cost-of-ownership (CoO) of a substrate processing line. In one embodiment, the screen printing system, hereafter system, is adapted to perform a screen printing process within a portion of a crystalline silicon solar cell production line in which a substrate is patterned with a desired material in two or more layers and is then processed in one or more subsequent processing chambers. The subsequent processing chambers may be adapted to perform one or more bake steps and one or more cleaning steps. In one embodiment, the system is a module positioned within the Softline™ tool available from Baccini S.p.A., which is owned by Applied Materials, Inc. of Santa Clara, Calif. While the discussion below primarily discusses the processes of screen printing a pattern, such as an interconnect or contact structure, on a surface of a solar cell device this configuration is not intended to be limiting as to the scope of the invention described herein.

Figure 1A:
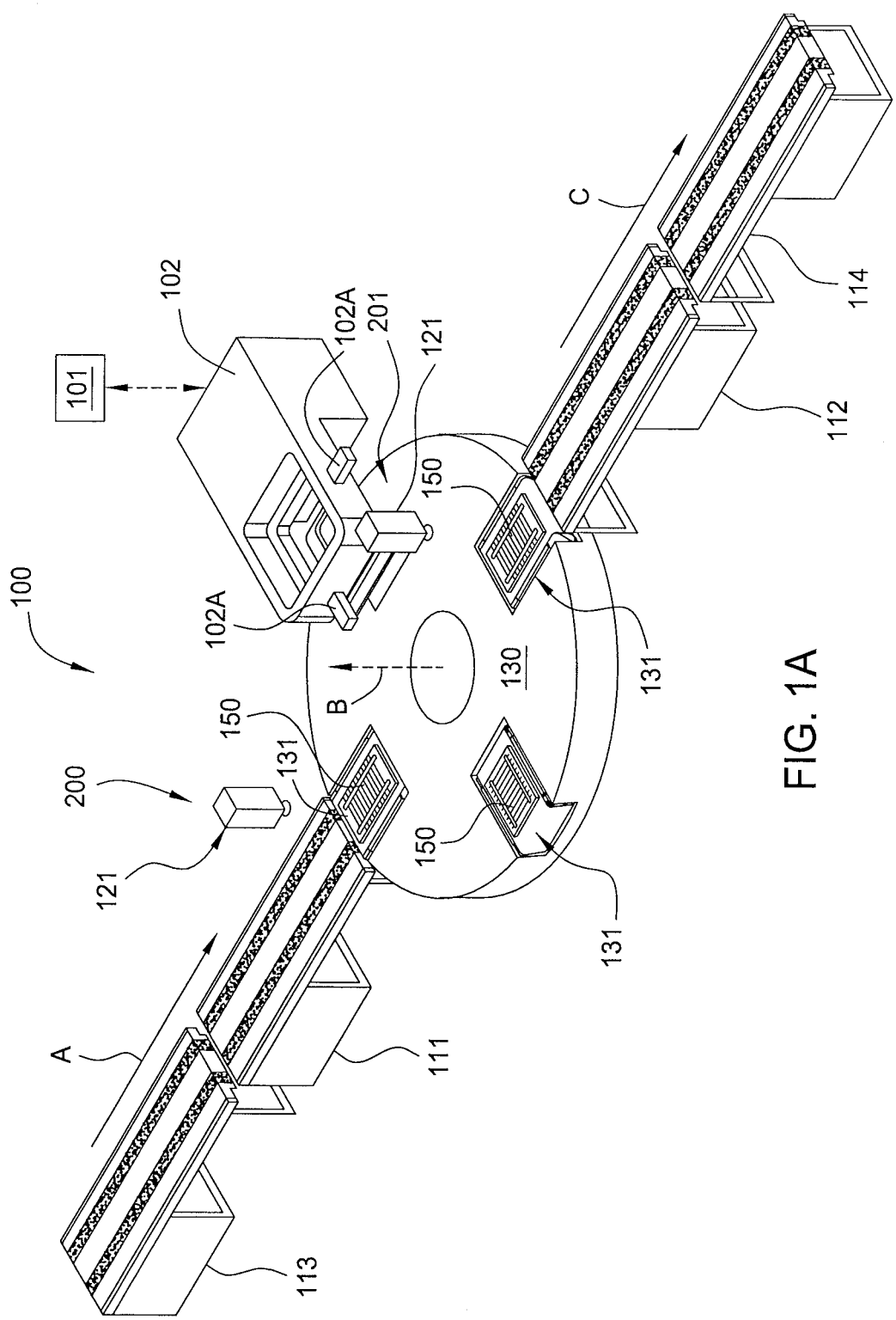
FIG. 1A is a schematic isometric view of a system that may be used in conjunction with embodiments of the present invention to form multiple layers of a desired pattern.
Figure 1B:
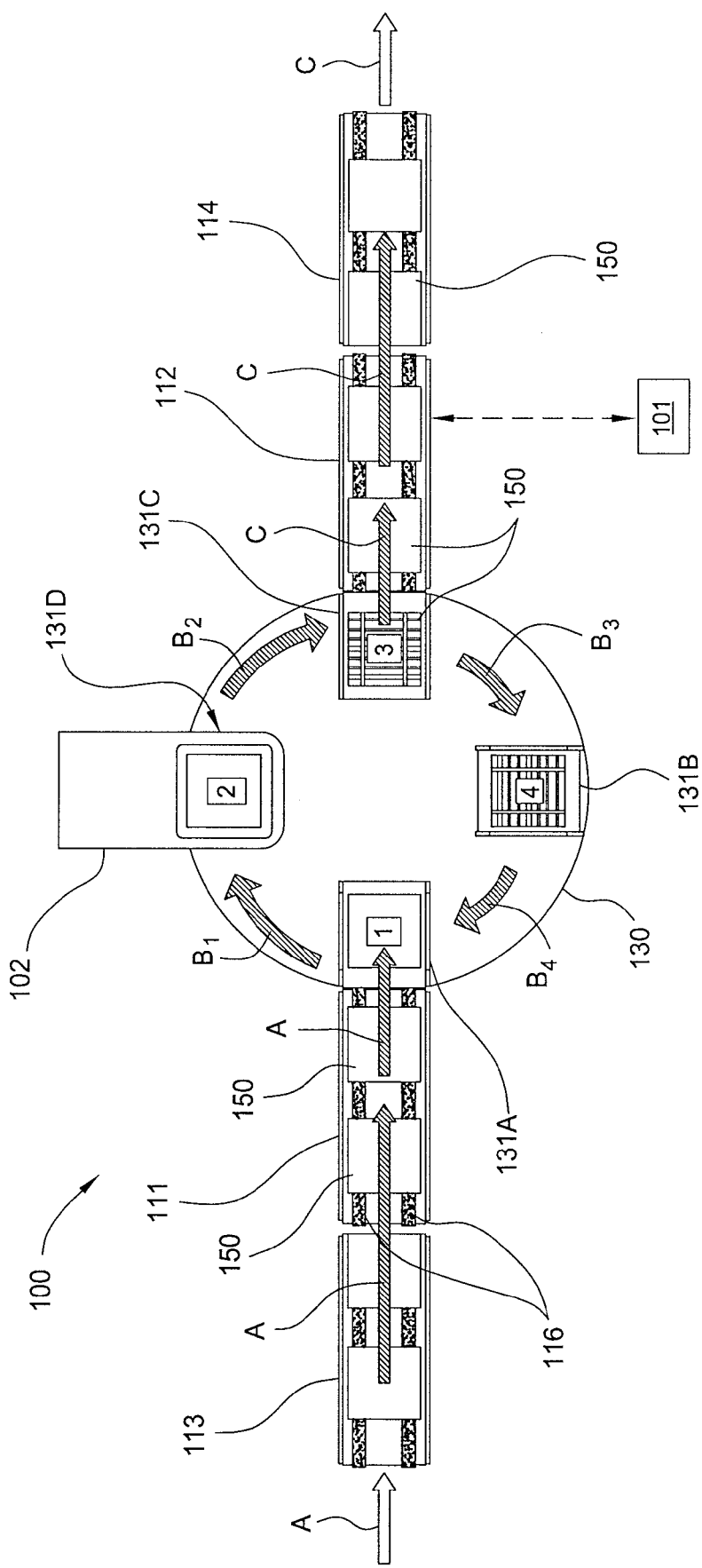
FIG. 1B is a schematic top plan view of the system in FIG. 1A.

FIG. 1A is a schematic isometric view and FIG. 1B is a schematic plan view illustrating one embodiment of a screen printing system, or system 100, that may be used in conjunction with embodiments of the present invention to form a desired pattern on a surface of a solar cell substrate 150. In one embodiment, the system 100 comprises an incoming conveyor 111, a rotary actuator assembly 130, a screen print chamber 102, and an output conveyor 112. The incoming conveyor 111 may be configured to receive a substrate 150 from an input device, such as an input conveyor 113, and transfer the substrate 150 to a printing nest 131 coupled to the rotary actuator assembly 130. The output conveyor 112 may be configured to receive a processed substrate 150 from a printing nest 131 coupled to the rotary actuator assembly 130 and transfer the substrate 150 to a substrate removal device, such as an exit conveyor 114. The input conveyor 113 and the exit conveyor 114 may be automated substrate handling devices that are part of a larger production line. For example, the input conveyor 113 and the exit conveyor 114 may be part of the Softline™ tool, of which the system 100 may be a module.

Figure 5:
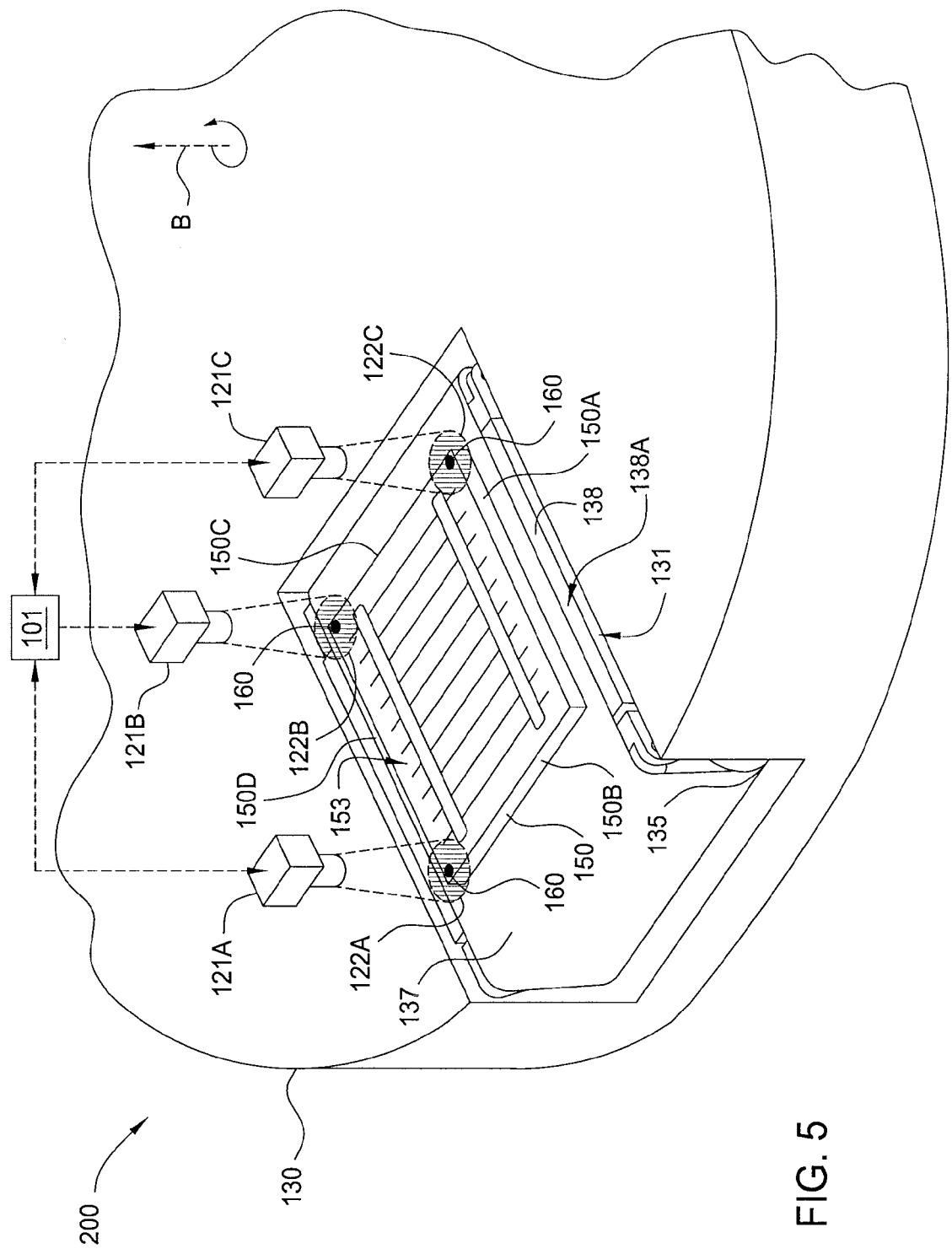
FIG. 5 is a schematic isometric view of one embodiment of the rotary actuator assembly in which the inspection assembly includes a plurality of optical inspection devices.

In one configuration, as Illustrated in FIG. 5, each printing nest 131 generally consist of a conveyor assembly that has a feed spool 135, a take-up spool (not shown), and one or more actuators (not shown), which are coupled to the feed spool and/or take-up spool, that are adapted to feed and retain a supporting material 137 positioned across a platen 138. The platen 138 generally has a substrate supporting surface on which the substrate 150 and supporting material 137 are positioned during the screen printing process performed in the screen printing chamber 102. In one embodiment, the supporting material 137 is a porous material that allows a substrate 150, which is disposed on one side of the supporting material 137, to be retained on the platen 138 by a vacuum applied to the opposing side of the supporting material 137 by a conventional vacuum generating device (e.g., vacuum pump, vacuum ejector). In one embodiment, a vacuum is applied to vacuum ports (not shown) formed in the substrate supporting surface 138A of the platen 138 so that the substrate can be "chucked" to the substrate supporting surface 138A of the platen. In one embodiment, the supporting material 137 is a transpirable material that consists, for instance, of a transpirable paper of the type used for cigarettes or another analogous material, such as a plastic or textile material that performs the same function. An example of an exemplary printing nest design is further described in the co-pending U.S. patent application Ser. No. 12/257,159 [Atty. Dkt. No. 13565], filed Oct. 23, 2008, which is herein incorporated by reference.

As shown in FIG. 1A, the rotary actuator assembly 130 may be rotated and angularly positioned about the "B" axis by a rotary actuator (not shown) and a system controller 101, such that the printing nests 131 may be selectively angularly positioned within the system 100. The rotary actuator assembly 130 may also have one or more supporting components to facilitate the control of the print nests 131 or other automated devices used to perform a substrate processing sequence in the system 100.

In one embodiment, the rotary actuator assembly 130 includes four printing nests 131, or substrate supports, that are each adapted to support a substrate 150 during the screen printing process performed within the screen printing chamber 102. FIG. 1B schematically illustrates the position of the rotary actuator assembly 130 in which one printing nest 131A is in position "1" to receive a substrate 150 from the incoming conveyor 111, another printing nest 131B is in position "2" within the screen printing chamber 102 so that another substrate 150 can receive a screen printed pattern on a surface thereof, another printing nest 131C is in position "3" for transferring a processed substrate 150 to the output conveyor 112, and another printing nest 131D is in position "4", which is an intermediate stage between position "1" and position "3".

In one embodiment, the screen printing chamber 102 in system 100 uses conventional screen printing heads available from Baccini S.p.A., which are adapted to deposit material in a desired pattern on the surface of the substrate 150 positioned on a printing nest 131 that is positioned in position "2" during the screen printing process. In one embodiment, the screen printing chamber 102 contains a plurality of actuators, for example, actuators 102A (e.g., stepper motors, servo-motors) that are in communication with the system controller 101 and are used to adjust the position and/or angular orientation of the screen printing mask to the substrate via commands sent from the system controller 101. In one embodiment, the screen printing chamber 102 is adapted to deposit a metal containing or dielectric containing material on the solar cell substrate 150. In one embodiment, the solar cell substrate 150 has a width between about 125 mm and about 156 mm and a length between about 70 mm and about 156 mm.

In one embodiment, the system 100 includes an inspection assembly 200 adapted to inspect a substrate 150 located on the printing nest 131 in position "1". The inspection assembly 200 may include one or more cameras 121 positioned to inspect an incoming, or processed substrate 150, located on the printing nest 131 in position "1". In one embodiment, the inspection assembly 200 includes at least one camera 121 (e.g., CCD camera) and other electronic components capable of inspecting and communicating the inspection results to the system controller 101 used to analyze the orientation and position of the substrate 150 on the printing nest 131. In one embodiment, the printing nests 131 may each contain a lamp 123 (FIG. 4B), or other similar optical radiation device, to illuminate a substrate 150 positioned on the printing nest 131 so that it can be more easily inspected by an inspection assembly 200.

In one embodiment, the system 100 may also include a second inspection assembly 201 that is positioned to inspect a substrate after the material is deposited on the surface of the substrate in the screen printing chamber 102 to analyze the position of the deposited layer on the substrate surface. In one configuration, the second inspection assembly 201 is similar to the inspection assembly 200, discussed above, and is generally capable of inspecting and communicating the inspection results to the system controller 101. In one example, the second inspection assembly 201 is adapted to inspect a substrate 150 located on the printing nest 131 in position "3". The inspection assembly 201 may include one or more cameras 121 (e.g., CCD camera) positioned to inspect a processed substrate 150 located on the printing nest 131 in position "3".

The system controller 101 facilitates the control and automation of the overall system 100 and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, detectors, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, which includes code to generate and store at least substrate positional information, the sequence of movement of the various controlled components, substrate inspection system information, and any combination thereof. In one embodiment of the present invention, the system controller 101 includes pattern recognition software to resolve the positions of alignment marks as subsequently described with respect to FIGS. 3A-3D. The pattern recognition software can also be used to correct for distortion or variation in the alignment mark shape so that a more accurate data can be collected about the actual position of the screen printed pattern. In one embodiment, the pattern recognition software is adapted to measure the distortion of the alignment mark relative to its expected shape by use of an image received by the system controller 101 from the inspection assembly 200, and then use conventional geometric/mathematical techniques to define the actual position of the alignment mark and screen printed pattern.

Figure 2:
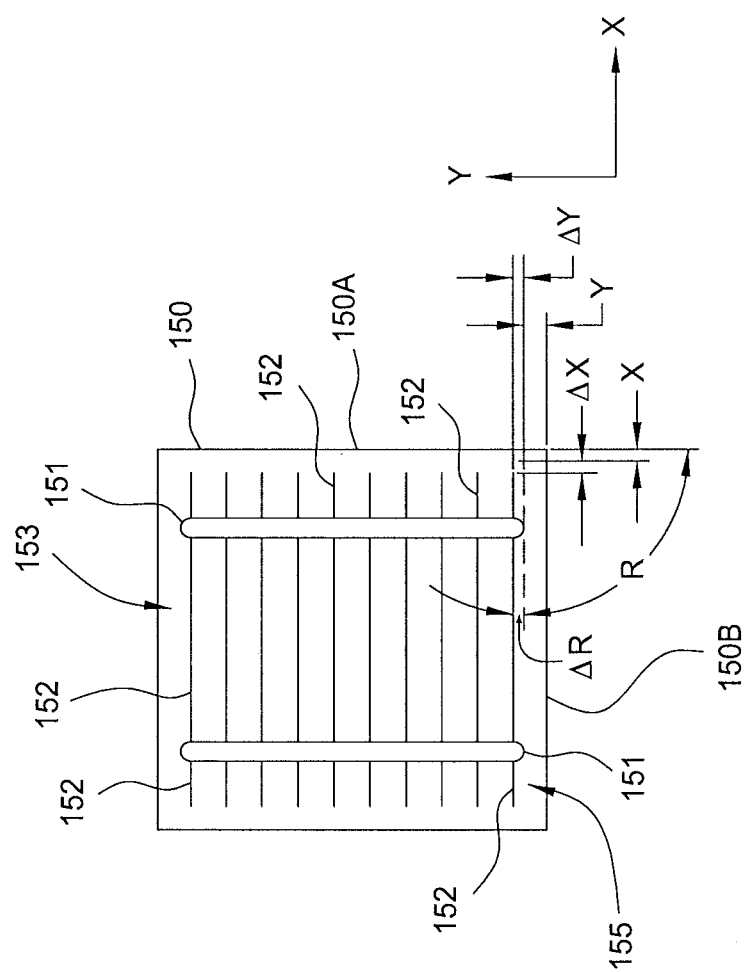
FIG. 2 is a plan view of a front surface, or light receiving surface, of a solar cell substrate.

FIG. 2 is a plan view of a front surface 155, or light receiving surface, of a solar cell substrate 150. Electrical current generated by the junction formed in a solar cell when illuminated flows through a front contact structure 156 disposed on the front surface 155 of the solar cell substrate 150 and a back contact structure (not shown) disposed on the back surface (not shown) of the solar cell substrate 150. The front contact structure 156, as shown in FIG. 2, may be configured as widely-spaced thin metal lines, or fingers 152, that supply current to larger bus bars 151. Typically, the front surface 155 is coated with a thin layer of dielectric material, such as silicon nitride (SixNy), which acts as an antireflection coating (ARC) to minimize light reflection. The back contact structure (not shown) is generally not constrained to thin metal lines since the back surface of the solar cell substrate 150 is not a light receiving surface.

In one embodiment, the placement of the buss bars 151 and the fingers 152 on the front surface 155 of the substrate 150 depends on the alignment of a screen printing device used in the screen printing chamber 102 (FIG. 1A) with respect to the positioning of the substrate 150 on the printing nest 131. The screen printing device generally has a screen printing mask contained in the screen printing chamber 102 that has a plurality of holes, slots, or other features formed therein to define the pattern and placement of screen printed ink or paste on the front surface 155 of the substrate 150. Typically, the alignment of the screen printed pattern 153 of fingers 152 and buss bars 151 on the surface of the substrate 150 is dependent on the alignment and orientation of the screen printing mask to a feature of the substrate 150, such as an edge 150A, 150B of the substrate 150. For instance, the placement of a single layer screen printed pattern of buss bars 151 and fingers 152 may have an expected position X and an expected angle orientation R with respect to an edge 150A and an expected position Y with respect to an edge 150B of the substrate 150 as shown in FIG. 2. The positional error of the single layer of the screen printed pattern of fingers 152 and buss bars 151 on the front surface 155 of the substrate 150 from the expected position (X, Y) and the expected angular orientation R on the front surface 155 of the substrate 150 may be described as a positional offset ($\Delta X, \Delta Y$) and an angular offset $\Delta R$. Thus, the positional offset ($\Delta X, \Delta Y$) is the error in the placement of the pattern of buss bars 151 and fingers 152 relative to the edges 150A and 150B, and the angular offset $\Delta R$ is the error in the angular alignment of the printed pattern of buss bars 151 and fingers 152 relative to the edge 150B of the substrate 150. The misplacement of a single layer of the screen printed pattern of buss bars 151 and fingers 152 on the front surface 155 of the substrate 150 can affect the ability of the formed device to perform correctly and thus affect the device yield of the system 100.

In an effort to improve the accuracy with which the screen printed pattern is aligned with an edge of the substrate or other feature, embodiments of the invention utilize one or more optical inspection devices, the system controller 101, and one or more alignment marks, which are formed on the front surface 155 of the substrate 150 during the printing of the first layer of the screen printed pattern to automatically adjust the alignment of the screen printed pattern with respect to the substrate. In general, the screen printed pattern 153 can be aligned in an automated fashion to a surface of a substrate by use of the information received by the system controller 101 from the one or more optical inspection devices and the ability of the system controller 101 to control the screen printing mask's position and orientation relative to the substrate's surface. The screen printing mask is generally coupled to one or more mechanical actuators 102A (FIG. 1A) that are adapted position and align the screen printing mask to a desired position within the screen printing chamber 102 in an automated fashion. In one embodiment, the optical inspection device includes one or more components contained in the inspection assembly 200. In one embodiment, the one or more alignment marks, or fiducial marks, may include the alignment marks 160 illustrated in FIGS. 3A-3D described below.

FIG. 3A illustrates various examples of alignment marks 160, for example alignment marks 160A-160D, that may be formed on the front surface 155 of the substrate 150 during a screen printing process of the buss bars 151 and fingers 152 and used by the inspection assembly 200 to find the positional offset ($\Delta X, \Delta Y$) and the angular offset $\Delta R$ of the first layer of buss bars 151 and fingers 152 screen printed on the front surface 155 of the substrate 150. In one embodiment, the alignment marks 160 are printed on unused areas of the front surface 155 of the substrate 150 to prevent the alignment marks 160 from affecting the performance of the formed solar cell device. In one embodiment, the alignment marks 160 may have a circular shape (e.g., alignment mark 160A), a rectangular shape (e.g., alignment mark 160B), a cross shape (e.g., alignment mark 160C), or an alphanumeric shape (e.g., alignment mark 160D). It is generally desirable to select an alignment mark 160 shape that allows the pattern recognition software found in the system controller 101 to accurately resolve the actual position of the alignment mark 160, and thus the actual position of the screen printed pattern of buss bars 151 and fingers 152, on the front surface 155 of the substrate 150 from the image viewed by the inspection assembly 200. The system controller 101 may then resolve the positional offset ($\Delta X, \Delta Y$) from the expected position (X, Y) and the angular offset $\Delta R$ from the expected angular orientation R and adjust the alignment of the screen printing mask in the screen printing device to minimize the positional misalignment of the buss bars 151 and fingers 152 on the substrate surface. Thus, the alignment of each of the printing nests 131, which are positioned within the rotary actuator assembly 130, and the screen printing chamber 102 components will need to be separately adjusted, since the position of each of the printing nests 131 relative to the rotary actuator assembly 130, incoming conveyor 111, and printing chamber 102 will each vary. It is believed that by use of discrete, desirably shaped alignment marks (e.g., circular shaped), and positioned at opposing edges of the substrate the orientation and the position of the deposited layer can be more accurately resolved.

FIGS. 3B-3D illustrate various configurations of alignment marks 160 on the front surface 155 of the substrate 150 that may be used to improve the accuracy of the offset measurements calculated by the system controller 101 from the images received by the inspection assembly 200. FIG. 3B illustrates one configuration in which two alignment marks 160 are placed near opposite corners on the front surface 155 of the substrate 150. In this embodiment, by spreading the alignment marks 160 as far apart as possible, the relative error to a feature on the substrate 150, such as the edge 150A or 150B, may be more accurately resolved. FIG. 3C illustrates another configuration in which three alignment marks 160 are printed on the front surface 155 of the substrate 150 near various corners to help resolve the offset of the first layer of the pattern of buss bars 151A and fingers 152A.

FIG. 3D illustrates another configuration in which three alignment marks 160 are printed in strategic positions across the front surface 155 of the substrate 150. In this embodiment, two of the alignment marks 160 are positioned in a line parallel to the edge 150A, and the third alignment mark 160 is positioned a distance perpendicular to the edge 150A. In this embodiment, the pattern recognition software in the system controller 101 creates perpendicular reference lines L1 and L2 to provide additional information about the position and orientation of the first layer of buss bars 151A and fingers 152A relative to the substrate 150.

In some cases, the deposited screen printed pattern and alignment marks 160 may tend to distort or varying shape in one or more directions due to the mechanical process of depositing the screen printing pattern. In one embodiment, it is desirable to position each of the alignment marks 160 on the surface of the substrate 150 so that its variation in shape will minimally affect the positional offset data collected by the pattern recognition software in the system controller 101.

Figure 4B:
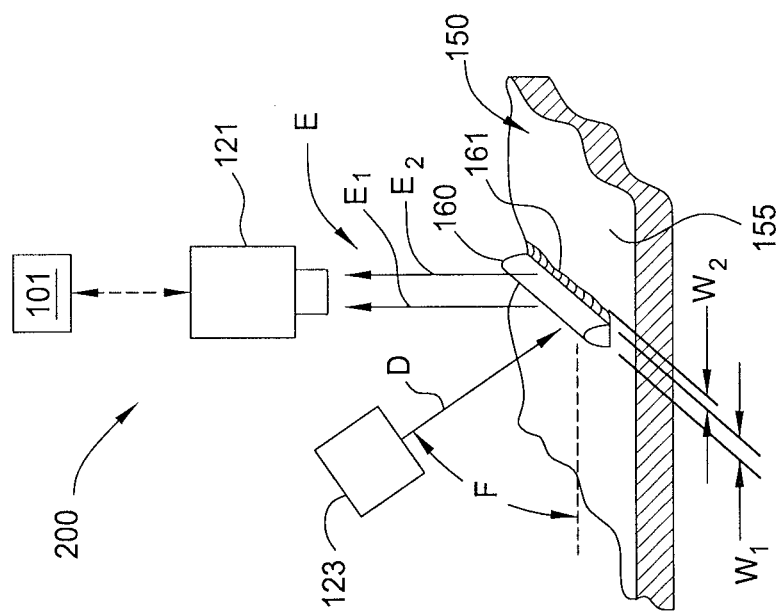
FIG. 4B illustrates an embodiment of the rotary actuator assembly for controlling illumination of the front surface of the substrate.
Figure 4A:
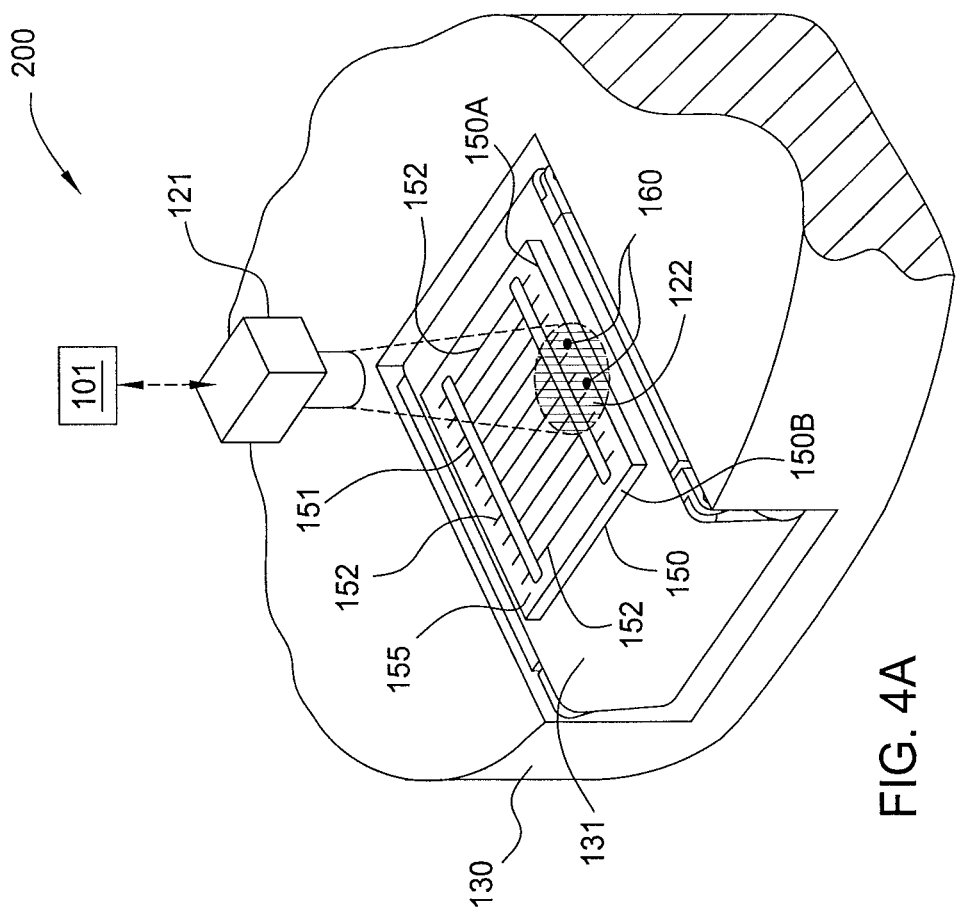
FIG. 4A is a schematic isometric view of one embodiment of a rotary actuator assembly that illustrates a configuration in which an inspection assembly is positioned to inspect the front surface of the substrate.

FIG. 4A is a schematic isometric view of one embodiment of the rotary actuator assembly 130 that illustrates a configuration in which the inspection assembly 200 is positioned to inspect the front surface 155 of the substrate 150 disposed on the printing nest 131. In one embodiment, a camera 121 is positioned over the front surface 155 of the substrate 150 so that a viewing area 122 of the camera 121 can inspect at least one region of the front surface 155 on the substrate 150. In one embodiment, the viewing area 122 is positioned so that it views one or more alignment marks 160 and a feature of the substrate 150, such as the substrate edge 150A, to provide information to the system controller 101 regarding the offset of the screen printed pattern of a first layer of buss bars 151A and fingers 152A. In one embodiment, the viewing area 122 is positioned so that it views multiple features on the substrate 150, such as edges 150A and 150B, and one or more alignment marks 160 to provide coordinate information regarding the positional offset of the alignment marks 160 from the ideal position and thus the positional offset ($\Delta X$, $\Delta Y$) and the angular offset $\Delta R$ of the buss bars 151 and fingers 152 on the front surface 155 of the substrate 150.

FIG. 4B illustrates an embodiment of the optical inspection assembly 200 for controlling illumination of the front surface 155 of the substrate 150 in order to improve the accuracy of the positional information received by the camera 121. In one embodiment, a lamp 123 may be oriented so that a shadow 161 created by the blockage of the projected light "D" from the lamp 123 by the alignment mark 160 is minimized. In general, the shadow 161 may affect the measured sized of the alignment mark 160, since the reflected light "E" contains at least a first component E1 reflected from the alignment mark 160 and a second component E2 reflected from the shadow region 161. The shadow 161 having a width W2 may affect the ability of the camera 121 to discern between the true width W1 of the alignment mark 160 and the apparent width W1+W2 of the alignment mark 160. Therefore, it may be desirable to orient the lamp 123 as close to normal (i.e., 90 degrees) to the front surface 155 of the substrate 150 as possible to reduce the size of the shadow 161. In one embodiment, the lamp 123 is oriented at an angle "F" from between about 80 degrees and about 100 degrees. In another embodiment, the lamp 123 is oriented at an angle F from between about 85 degrees and about 95 degrees.

In one embodiment, it is also desirable to control the wavelength of light that is delivered from the lamp 123 to help improve the ability of the optical inspection assembly 200 to accurately resolve the position of the alignment mark 160 on the front surface 155 of the substrate 150. In one embodiment, the lamp 123 uses a red LED to illuminate the front surface 155 of the substrate 150. A red LED light may be especially effective when the buss bars 151 and fingers 152 are printed on a silicon nitride (SiN) antireflection coating (ARC) layer that is typically formed on the front surface 155 of a solar cell substrate 150. In one embodiment, it is desirable to position the viewing area 122 of the camera 121 on the alignment mark 160 printed in an area where the ARC is formed on the front surface 155 of the substrate 150.

FIG. 5 is a schematic isometric view of one embodiment of the rotary actuator assembly 130 in which the inspection assembly 200 includes a plurality of optical inspection devices. In one embodiment, the inspection assembly 200 includes three cameras 121A, 121B, and 121C that are adapted to view three different regions of the front surface 155 of the substrate 150. In one embodiment, the cameras 121A, 121B, and 121C are each positioned to view a region of the front surface 155 of the substrate 150 having a printed alignment mark 160 contained therein. In this embodiment, the measurement accuracy of the placement of the first layer of buss bars 151 and fingers 152 may be improved due to the ability to reduce the size of each of the respective viewing areas 122A, 122B, and 122C, and thus increase the resolution, or number of pixels per unit area, while still allowing the positions of the alignment marks 160 to be spread across the front surface 155 of the substrate 150 as much as possible to allow the system controller to better resolve any alignment error. In one example, each of the cameras 121A, 121B, and 121C are a 3 Mega-pixel CCD camera that is positioned to view an area of about 352 mm2 of a substrate that has a surface area of about 24,650 mm2. However, if one wanted to achieve the same optical resolution of all of the alignment marks using a single camera that had to view the complete substrate surface would require a 210 Mega-pixel CCD camera that would either be prohibitively expensive and/or it does not commercially exist today.

Figure 6:
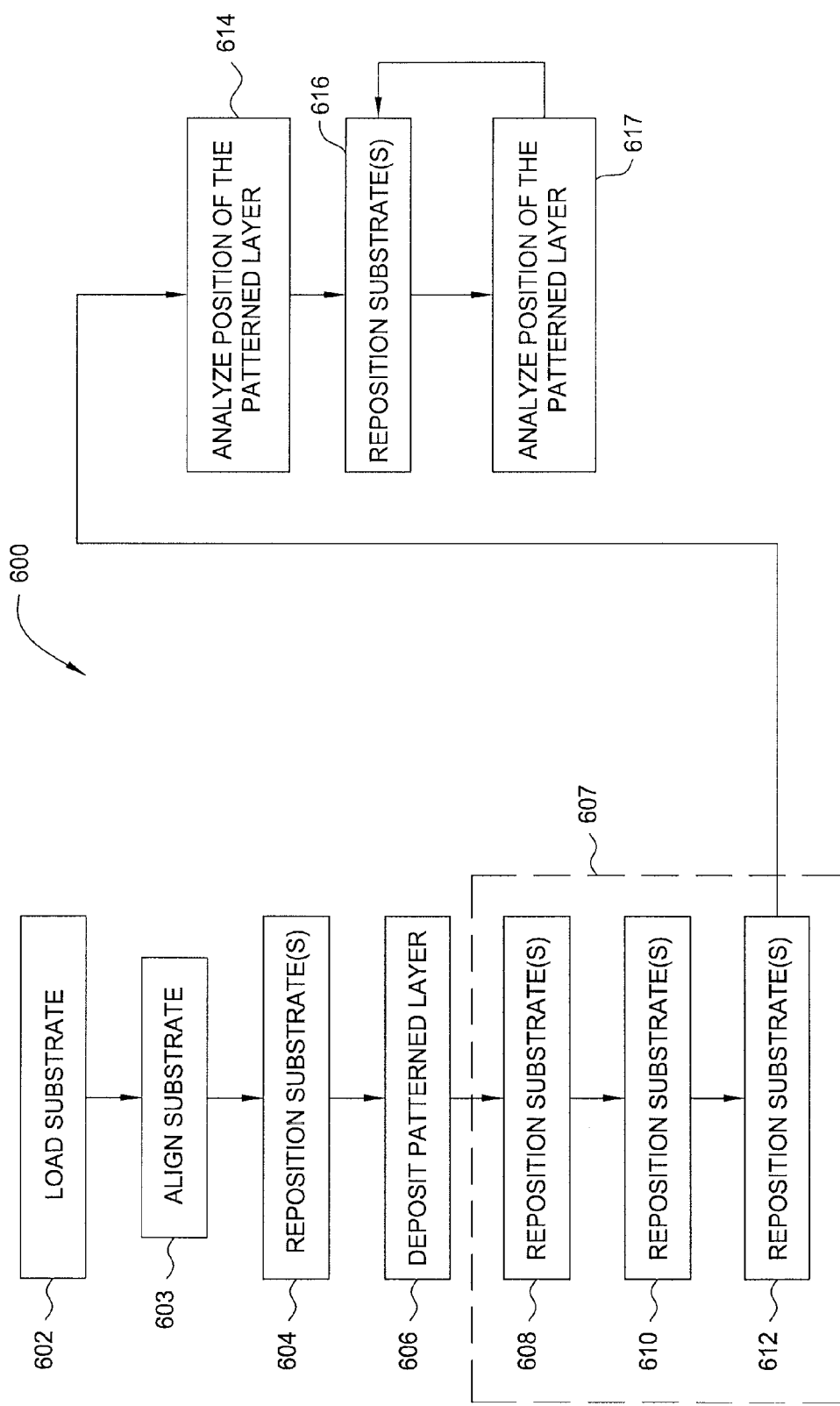
FIG. 6 is a schematic diagram of an operational sequence for accurately screen printing a double layered pattern on the front surface of the substrate 150 according to one embodiment of the present invention.

FIG. 6 is a schematic diagram of an operational sequence 600 for accurately screen printing a pattern on the front surface 155 of the substrate 150 according to one embodiment of the present invention. The processes discussed in the operational sequence 600 can thus be used to calibrate and accurately align each of the substrate supporting devices, such as the printing nests 131 that will be used to support and position substrates within the printing chamber 102. The methods described herein can be used during the initial setup of the system 100, during regular maintenance activities, as a random quality check of the deposition process and/or as a method to correct process drift.

Referring to FIGS. 1B and 6, in a substrate loading operation 602, a first substrate 150 is loaded along the path "A" onto the printing nest 131A located in position "1" of the rotary actuator assembly 130. In one example, as illustrated in FIGS. 1A, 1B and 5, a supporting material 137 in the printing nest 131 is adapted to cooperatively receive the substrate 150 from the belts 116 contained in the incoming conveyor 111 using the commands sent by the system controller 101.

Next, in a first alignment operation 603, the optical inspection assembly 200 positioned adjacent to position "1" is used to capture an image of the blank front surface 155, and/or one or more features of the substrate 150 (e.g., edges 150A-150D illustrated in FIGS. 4A or 5), and based on the image, the system controller 101 uses the collected data to adjust the position of the screen printing mask to accurately deposit a desired pattern on the front surface 155 of the substrate 150 in a subsequent operation. The position of the screen printed pattern is then based on the collected orientation and position of the substrate 150 on the platen 138 information received by the optical inspection assembly 200.

In operation 604, the rotary actuator assembly 130 is rotated such that the printing nest 131A containing the loaded substrate 150 is moved in a clockwise direction along a path B1 into position "2" within the printing chamber 102.

In operation 606, a first layer of a screen printing pattern, such as buss bars 151, fingers 152, and at least two alignment marks 160, is printed on the front surface 155 of the substrate 150. In one embodiment, the three or more alignment marks 160 are printed on the front surface 155 of the substrate 150. In one embodiment, a second substrate 150 is loaded onto the printing nest 131B now located in position "1". In this embodiment, the second substrate 150 follows the same path as the first loaded substrate 150 throughout the operational sequence.

In operation 607, the rotary actuator assembly 130 is rotated to position the printing nest 131A in position "1" so that the screen printed pattern on the substrate can be analyzed by the optical inspection assembly 200. In one embodiment, operation 607 includes a series of operations 608-612 that are used to re-position the printing nest 131A in position "1". In this embodiment, operation 607 includes a series of additional operations 608-610 that are used to load substrates onto each of the printing nests 131C-131D attached to the rotary actuator assembly 130, which are discussed below.

While processes discussed in the operational sequence 600 generally disclose the use of a rotary actuator assembly 130 that has four printing nests 131 this configuration is not intended to be limiting, since any number of substrate supporting devices that can be positioned by an automation assembly can be used without deviating from the basic scope of the invention described herein.

In operation 608, the rotary actuator assembly 130 is rotated such that the printing nest 131A containing the first loaded substrate 150 is moved in a clockwise direction along a path B2 into position "3". In one embodiment, the printing nest 131B containing the second substrate 150 is moved into position "2" for printing a first layer of the screen printing pattern thereon. In one embodiment, a third substrate 150 is loaded onto the printing nest 131C now located in position "1". In this embodiment, the third substrate 150 follows the same path as the second substrate 150 throughout the operational sequence.

In operation 610, the rotary actuator assembly 130 is rotated such that the printing nest 131A containing the first loaded substrate 150 is moved in a clockwise direction along a path B3 into position "4". In one embodiment, the printing nest 131B containing the second substrate 150 is moved into position "3". In one embodiment, the third loaded substrate 150 is moved into position "2" for printing a first layer of the screen printing pattern thereon. In one embodiment, a fourth substrate 150 is loaded onto the printing nest 131D now located in position "1". In this embodiment, the fourth substrate 150 follows the same path as the third substrate 150 throughout the operational sequence.

In operation 612, the rotary actuator assembly 130 is rotated such that the printing nest 131A containing the first loaded substrate 150 is moved in a clockwise direction along a path B4 back into position "1".

In operation 614, the alignment of the deposited layer of the screen printing pattern is analyzed by the optical inspection assembly 200 that is positioned adjacent to position "1". In one embodiment, the optical inspection assembly 200 captures images of at least two of the alignment marks 160 printed on the front surface 155 of the first substrate 150. The images are analyzed by the image recognition software in the system controller 101. The system controller 101 then calculates the positional offset ($\Delta X$, $\Delta Y$) and the angular offset $\Delta R$ from an expected position (X, Y) and expected angular orientation R of the screen printed pattern that is saved in the memory of the system controller 101 by analyzing the at least two alignment marks 160 relative to a feature of the substrate 150, such as the one or more edges 150A-150D or corners formed therefrom. The positional offset ($\Delta X$, $\Delta Y$) and the angular offset $\Delta R$ data can then be stored in the memory of the system controller 101. The system controller 101 then uses the positional offset ($\Delta X$, $\Delta Y$) and the angular offset $\Delta R$ information obtained from this analysis to adjust the position of the screen printing mask within the screen printing chamber 102, so that subsequently processed substrates that are positioned on the printing nest 131A will have a more accurately placed screen printed pattern.

Next, the alignment of the screen printing pattern deposited on each of the substrates positioned on each of the printing nests 131B-131D are each analyzed by the optical inspection assembly 200 (i.e., operation 617) as they are sequentially re-positioned at position "1" (i.e., operation 616). During operation 616, the rotary actuator assembly 130 is rotated so that a desired printing nest (e.g., reference numeral 131B-131D) is rotated back into position "1" so that the deposited layer on the substrate positioned on the desired printing nest can be inspected by the optical inspection assembly 200. The processes performed during each of the operations 617 on each of the substrate positioned on the printing nests 131B-131D are the same or similar to operation 614, discussed above. The positional offset ($\Delta X$, $\Delta Y$) and the angular offset $\Delta R$ data collected for each of the printing nests 131A-131D are thus stored in the memory of the system controller 101 for use on all of the subsequently processed substrates positioned in each of the respective printing nests.

One skilled in the art will appreciate that the alignment operation 603 is used to correct for the variation in the position of the substrate 150 relative to the platen 138 (FIG. 5) in the printing nest 131, and that the operation 614, 617 is used to correct for the error in the position of the printed pattern formed using the printing mask relative to a feature of the substrate. Therefore, while the alignment operation 603 is typically used on all substrates that are to be processed in the printing chamber 102 to correct for the variation in the position of the substrate 150 on the platen 138, the operation 614, and/or operation(s) 617, may be performed infrequently to correct or adjust for a variations in the placement of the screen printed pattern relative to the substrate overtime. As noted above, the methods described herein can thus be used during the initial setup of the system 100, during regular maintenance activities, as a random quality check of the deposition process, and/or as a method to correct process drift. In one embodiment, the system controller 101 is used to automatically analyze the orientation and position of the screen printed pattern at some desired interval within a series, or sequence, of substrates that are processed in the system 100 on each of the printing nests 131. In one configuration, the system controller is adapted to alter the orientation and/or position of the screen printed pattern deposited onto each of the subsequently processed substrates positioned on a printing nest using the most recent orientation and position data collected from a substrate positioned on the same printing nest. In one example, the system controller is adapted to analyze and re-adjust the oriented screen printed pattern every substrate, every other substrate, every third substrate, every tenth substrate, every hundredth substrate or other desired interval.

In one embodiment, the inspection assembly 200 is adapted to perform the alignment operation 603 and the second inspection assembly 201 is adapted to perform the operations 614 and 617. In one embodiment, during operation 607, the rotary actuator assembly 130 is rotated such that the printing nest is re-positioned in position "3" so that the screen printed pattern on the substrate can be analyzed by the optical inspection assembly 201. In this configuration, the orientation and position results received by the system controller 101 from each of the inspection assemblies 200, 201 may have to be calibrated and adjusted, so that any unwanted error created by taking measurements from two differently positioned and aligned inspection assemblies does not affect the accuracy of the automated alignment process results. In one example, it is desirable to minimize the orientation and position errors so that the placement of the patterned layer on the substrate is less than about ±60 micrometers (µm), and preferably less than about ±15 µm.

Alternate System Configuration

Figure 7:
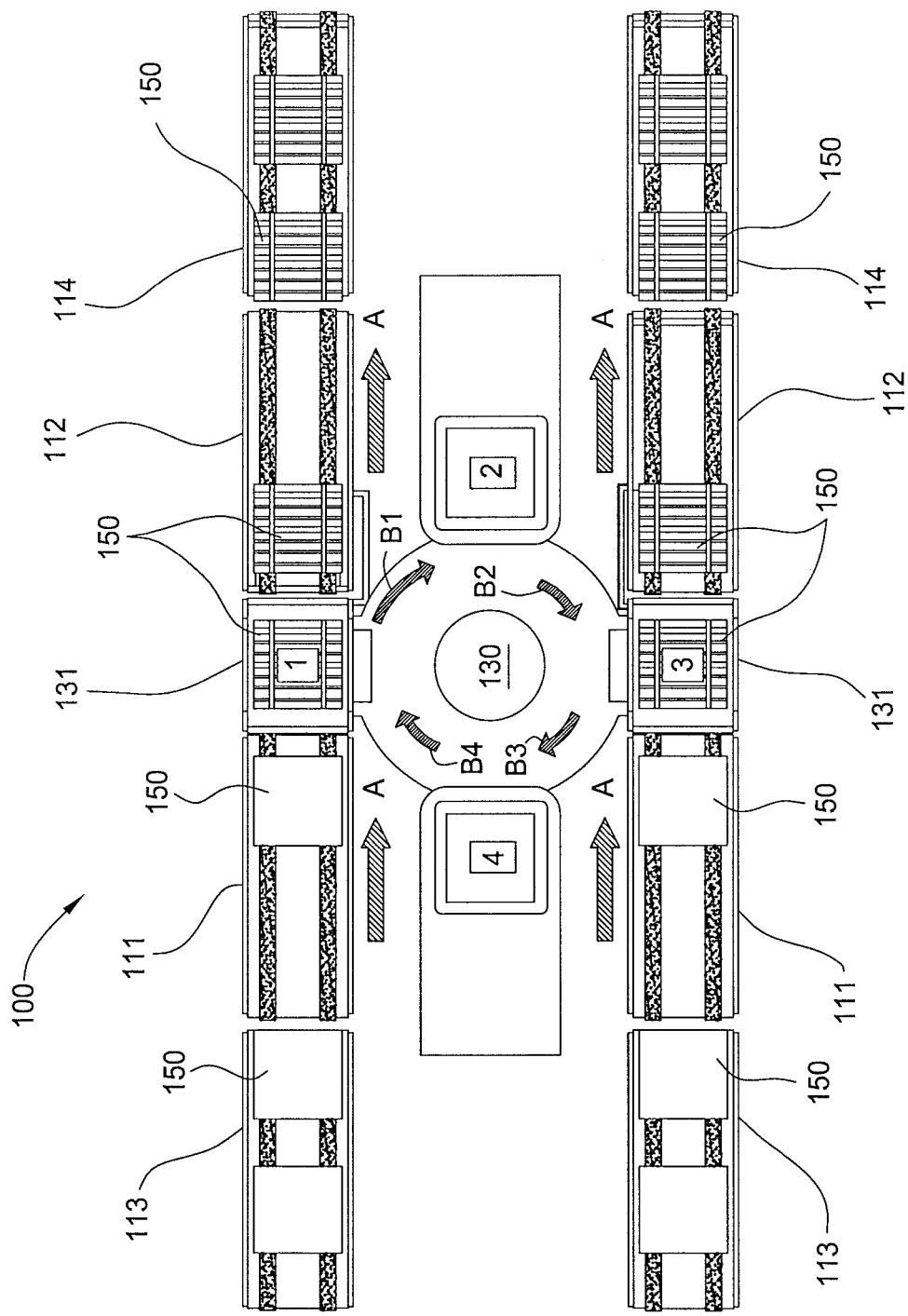
FIG. 7 is a top plan view of a system that may be used in conjunction with embodiments of the present invention to form multiple layers of a desired pattern.

Although embodiments of the present invention are depicted in FIGS. 1A and 1B with respect to a system 100 having a single input and single output, embodiments of the invention are equally applicable to a system 700 having dual inputs and dual outputs as depicted in FIG. 7.

FIG. 7 is a top plan view of a system 700 that may be used in conjunction with embodiments of the present invention to form a desired pattern, such as buss bars 151 and fingers 152, on the front surface 155 of the substrate 150. As shown, the system 700 differs from the system 100 depicted in FIGS. 1A and 1B in that the system 700 includes two incoming conveyor 111 and two output conveyors 112. The system 700 also differs from the system 100 in that the system 700 includes two screen printing chambers 102. However, the operating sequence of embodiments of the invention with respect to the system 700 is substantially the same as with respect to the system 100. For instance, the operating sequence 600 with respect to the first substrate 150 initially loaded into position "1" is the same as previously described with respect to FIG. 6. However, the operating sequence 600 may run simultaneously with the second substrate 150 initially loaded into position "3".

While the foregoing is directed to embodiments of the present invention, other and further embodiments of the invention may be devised without departing from the basic scope thereof, and the scope thereof is determined by the claims that follow.

The invention claimed is:

1. An automated deposition process, comprising:
positioning a first substrate on a substrate support, wherein the first substrate has at least one edge;
depositing a layer of a material in a pattern onto a surface of the first substrate, wherein the pattern includes at least two alignment marks;
determining the actual orientation and position of the at least two alignment marks with respect to the at least one edge of the first substrate using a system controller; and
depositing a layer of a material in a pattern onto a surface of a second substrate in an adjusted orientation or adjusted position relative to at least one edge of the second substrate using the information received by the system controller during the determining the actual orientation and actual position of the at least two alignment marks, wherein the orientation or position of the material deposited on the second substrate is closer to an expected orientation or expected position than the orientation or position of the material deposited on the first substrate to the expected orientation or expected position.

2. The automated deposition process of claim 1, wherein the material comprises lines of conductive material.

3. The automated deposition process of claim 2, wherein the substrate is polygonal and each of the at least two marks is printed in a different corner region.

4. The automated deposition process of claim 1, wherein the determining the actual orientation and position of the at least two alignment marks comprises capturing an optical image of the alignment marks and recognizing a physical characteristic of the alignment marks on the optical image.

5. The automated deposition process of claim 4, wherein the expected orientation or expected position of the alignment marks is determined with respect to the at least one edge of the substrate prior to printing the first layer.

6. The automated deposition process of claim 4, wherein at least three alignment marks are printed on the surface of the substrate.

7. The automated deposition process of claim 6, wherein the determining the actual orientation and position of the at least two alignment marks comprises constructing a first reference line between two of the alignment marks and constructing a second reference line between a third alignment mark and the first reference line, wherein the second reference line is perpendicular to the first reference line.

8. An automated deposition process, comprising:
positioning a first substrate on a substrate support, wherein the first substrate has at least one edge;
analyzing the orientation and position of the first substrate on the substrate support using a system controller;
depositing a layer of a material in a pattern onto a surface of the first substrate, wherein the pattern includes at least two alignment marks and is aligned to the at least one edge of the first substrate using the data received by the system controller during the analyzing the orientation and position of the substrate;
determining the actual orientation and actual position of the deposited layer on the first substrate using the system controller;
calculating an offset between the actual orientation and actual position of the deposited layer of material and an expected orientation and expected position; and
depositing a layer of a material in a pattern onto on a second substrate using the calculated offset so that the orientation or position of the material deposited on the second substrate is closer to an expected orientation or expected position than the orientation or position of the material deposited on the first substrate to the expected orientation or expected position.

9. The automated deposition process of claim 8, wherein the material comprises lines of conductive material.

10. The automated deposition process of claim 9, wherein the substrate is polygonal and each of the at least two marks is printed in a different corner region.

11. The automated deposition process of claim 8, wherein the determining the actual orientation and actual position of the at least two alignment marks comprises capturing an optical image of the alignment marks and recognizing a physical characteristic of the alignment marks on the optical image.

12. The automated deposition process of claim 8, wherein the expected orientation or expected position of the alignment marks is determined with respect to the at least one edge of the substrate prior to printing the first layer.

13. The automated deposition process of claim 8, wherein at least three alignment marks are printed on the surface of the substrate.

14. The automated deposition process of claim 8, wherein the determining the actual orientation and position of the at least two alignment marks comprises constructing a first reference line between two of the alignment marks and constructing a second reference line between a third alignment mark and the first reference line, wherein the second reference line is perpendicular to the first reference line.

15. An automated deposition process, comprising:
positioning a first substrate that is disposed on a substrate support in a first position, wherein the first substrate has at least one edge;
analyzing the orientation and position of the first substrate on the substrate support that is positioned in the first position using an optical inspection system and a system controller;
depositing a layer of a material in a pattern onto a surface of the first substrate that is disposed on the substrate support at a second position, wherein the pattern includes at least two alignment marks and is aligned to the at least one edge of the first substrate using the data received by the system controller during the analyzing the orientation and position of the first substrate;
positioning the first substrate and the substrate support in the first position;

determining the actual orientation and actual position of the deposited layer on the first substrate that is positioned in the first position using the optical inspection system and the system controller;

calculating an offset of between the actual orientation and actual position of the deposited layer of material and an expected orientation and expected position; and depositing a layer of a material in a pattern onto on a second substrate that is disposed on the substrate support in the second position using the calculated offset so that the orientation or position of the material deposited on the second substrate is closer to an expected orientation or expected position than the orientation or position of the material deposited on the first substrate to the expected orientation or expected position.

16. The automated deposition process of claim 15, further comprising:

depositing a layer of a material in a pattern onto at least one or more substrates that are each sequentially disposed on the substrate support;

depositing a layer of a material in a pattern onto an additional substrate after depositing a layer of a material on the at least one or more substrates;

positioning the additional substrate and the substrate support in the first position;

determining the actual orientation and actual position of the deposited layer on the additional substrate that is positioned in the first position using the optical inspection system and the system controller;

calculating an offset of between the actual orientation and actual position of the deposited layer of material and an expected orientation and expected position; and depositing a layer of a material in an alternate pattern onto on a second additional substrate that is disposed on the substrate support in the second position using the calculated offset so that the orientation or position of the material deposited on the second additional substrate is closer to an expected orientation or expected position than the orientation or position of the material deposited on the additional substrate to the expected orientation or expected position.

17. The automated deposition process of claim 16, wherein the substrate is polygonal and each of the at least two marks is printed in a different corner region.

18. The automated deposition process of claim 15, wherein the determining the actual orientation and actual position of the at least two alignment marks comprises capturing an optical image of the alignment marks and recognizing a physical characteristic of the alignment marks on the optical image.

19. The automated deposition process of claim 15, wherein the expected orientation or expected position of the alignment marks is determined with respect to the at least one edge of the substrate prior to printing the first layer.

20. The automated deposition process of claim 15, wherein at least three alignment marks are printed on the surface of the substrate.

21. The automated deposition process of claim 15, wherein the determining the actual orientation and position of the at least two alignment marks comprises constructing a first reference line between two of the alignment marks and constructing a second reference line between a third alignment mark and the first reference line, wherein the second reference line is perpendicular to the first reference line.

* * * * *